(12) United States Patent
Reith (10) Patent No.: US 11,342,865 B2
(45) Date of Patent: May 24, 2022

(54) METHOD AND DEVICE FOR ACTUATING AN ELECTROMECHANICAL ELEMENT

(71) Applicant: Physik Instrumente (PI) GmbH & Co. KG, Karlsruhe (DE)

(72) Inventor: Jeremias Reith, Hochstadt (DE)

(73) Assignee: Physik Instrumente (PI) GmbH & Co. KG, Houston, TX (US)

( * ) Notice: Subject to any disclaimer, the term of this patent is extended or adjusted under 35 U.S.C. 154(b) by 947 days.

(21) Appl. No.: 16/077,259

(22) PCT Filed: Feb. 10, 2017

(86) PCT No.: PCT/DE2017/100105
§ 371 (c)(1),
(2) Date: Aug. 10, 2018

(87) PCT Pub. No.: WO2017/137044
PCT Pub. Date: Aug. 17, 2017

(65) Prior Publication Data
US 2019/0068083 A1    Feb. 28, 2019

(30) Foreign Application Priority Data
May 11, 2016 (DE) .......................... 102016108747.5

(51) Int. Cl.
  *H02N 2/06*    (2006.01)
  *H02N 2/02*    (2006.01)
  *H01L 41/04*   (2006.01)
(52) U.S. Cl.
  CPC ............. *H02N 2/062* (2013.01); *H02N 2/025* (2013.01); *H01L 41/042* (2013.01)

(58) Field of Classification Search
  CPC ........ H02N 2/062; H02N 2/025; H02N 2/067; H01L 41/042; H01L 41/09
  See application file for complete search history.

(56) References Cited

U.S. PATENT DOCUMENTS

| | | |
|---|---|---|
| 5,907,212 A | 5/1999 | Okada |
| 2010/0241274 A1 | 9/2010 | Ohtera et al. |
| 2018/0102717 A1* | 4/2018 | Hendriks ............. H01L 41/042 |

FOREIGN PATENT DOCUMENTS

| | | |
|---|---|---|
| DE | 102 44 432 A1 | 4/2003 |
| DE | 697 34 1 32 T2 | 7/2006 |

(Continued)

OTHER PUBLICATIONS

Examination Report for DE 10 2016 108 747.5, dated Aug. 30, 2016 (10 pages).

(Continued)

*Primary Examiner* — Emily P Pham
(74) *Attorney, Agent, or Firm* — The Juhasz Law Firm (57) ABSTRACT

Disclosed is a method and device for electrically activating an electromechanical element (8) for positioning an element to be driven which is in contact at least intermittently with the electromechanical element (8). By temporal sequence or by the successive execution of a static friction phase and a slip phase, the element to be driven performs a discrete drive step in a first drive direction, while by temporal sequence or successive execution of a slip phase and a static friction phase the element to be driven performs a discrete drive step in a second drive direction which is oriented contrary to the first drive direction. By appropriate repetition, a plurality of discrete drive steps and thus a large travel can be realized, which is limited in principle only by the extent or length of the element to be driven.

17 Claims, 5 Drawing Sheets

(56) References Cited

FOREIGN PATENT DOCUMENTS

| | | |
|---|---|---|
| DE | 102011108175 A1 | 1/2013 |
| DE | 10 2012 221 891 B3 | 2/2014 |
| EP | 0 747 977 A1 | 12/1996 |

OTHER PUBLICATIONS

Int'l Preliminary Report on Patentability (IPRP) for PCT/DE2017/100105, dated May 26, 2017 (10 pages).
Int'l Search Report (Translation) for PCT/DE2017/100105, dated May 26, 2017 (2 pages).

* cited by examiner

METHOD AND DEVICE FOR ACTUATING AN ELECTROMECHANICAL ELEMENT

This application claims priority, under the terms of 35 U.S.C. § 371(c), to PCT/DE2017/100105, filed Feb. 10, 2017; PCT/DE2017/100105 claims priority to German national application DE 102016102367.1, filed Feb. 11, 2016, and also claims priority to German national application DE 102016108747.5, filed May 11, 2016; these three patent documents are incorporated by reference in their entirety.

The invention relates to a method for controlling an electromechanical element, in particular a piezoelectric actuator or piezoactor, and a corresponding device for carrying out such a method.

A method for driving a piezoelectric actuator for a drive is known, in which the same is acted upon by a driver with an electrical voltage in the form of a sawtooth or a ramp with a flatter flank and a steeper flank, wherein the actuator performs, in the phase of the slower voltage change, i.e. in the region of the flatter flank, which is also called stick phase, a correspondingly slower expansion or contraction, and an element to be driven which is in frictional contact with the actuator can follow this slower movement due to static friction and consequently results in a drive movement or drive step, while in the phase of the fast voltage change, i.e. in the region of the steeper flank, which is also called slip phase, the actuator performs a substantially faster expansion or contraction which is so fast that due to the inertia of the element to be driven, said element can no longer follow the movement of the actuator, so that by sliding friction a relative movement between the piezoactor and the element to be driven occurs and substantially no drive movement results.

To realize a corresponding single step of the driven element either first a stick phase with an extension of the actor takes place, wherein the expansion occurs essentially in the drive direction of the element to be driven, with a subsequent slip-phase with a contraction of the actor takes place, wherein the contraction occurs essentially contrary to the drive direction, or else first a slip phase with an expansion of the actor takes place essentially contrary to the drive direction, followed by a stick phase with a contraction of the actor substantially in the drive direction. By selecting the corresponding sequence of stick and slip phases, the drive direction can be varied.

By means of repetition, a sequence of individual steps with a respective increment—depending on the mechanical design of the drive—typically about 100 to 600 nm can be generated, thereby enabling a quasi-continuous movement. Corresponding drives are also referred to as stick-slip drives or inertial drives.

The above-described control mode or the drive mode resulting therefrom is also referred to as a step mode, which can still be divided into a continuous and a discontinuous step mode or single step mode.

As long as the difference between the actual position and the target position, which is monitored by a controller electrically connected to the driver with the aid of a position sensor, is relatively large and above a defined value and outside a corresponding first value window around the target position, the piezoactor is controlled in such a way that a high, in particular the highest possible movement speed of the element to be driven with a maximum number of individual steps per time unit results, from which a relatively rough and inaccurate positioning (rough positioning) results. For this purpose, identical ramp-shaped voltage signals, which are triggered by the controller and which are generated in a corresponding manner by the driver, are output with a very high frequency and without temporal interruption between successive ramps of the voltage to the piezo actuator (continuous step mode).

As soon as the controller recognizes with the aid of the position sensor that the difference between the actual position and the target position of the element to be driven is small and lies within the aforementioned first value window, the controller causes a switching to the discontinuous step mode or single step mode, in which between successive ramp-shaped voltage signals, which have an identical shape and the shape of which is likewise identical to the ramp-shaped voltage signals during the continuous step mode, in each case a defined time interval exists. This time interval between successive ramp-shaped voltage signals is intended to enable the mechanical components which are excited by the drive movement of the piezoactor within a step to oscillate, to decay so that, before a possible subsequent step is carried out, it can be checked with high and reliable accuracy whether the difference between the actual position and the target position of the object to be driven element lies within a second value window, so that a substantially more accurate positioning results relative to the rough positioning. This second value window is defined by the maximum possible deformation or the stroke of the actor, which is typically less than 1 µm.

Accordingly, if the difference between the actual position and the desired position of the element to be driven is equal to or less than the maximum stroke of the piezoelectric actuator, the controller switches the mode again so that the drive changes into the so-called analogue mode, wherein in said analog mode of the piezoelectric actuator exerts an analog voltage applied to the applied voltage deformation with a very high resolution, so that a highly accurate positioning of the driven element can be realized. The controller specifies an analog voltage to control the position of the element to be driven.

A disadvantage of the previously described method according to the prior art is, on the one hand, the fact that a plurality of criteria must be provided to the controller, on the basis of which the latter transfers corresponding signals to the driver and, in particular, causes a change of the respective mode. These criteria include, in addition to the difference between the actual position and the target position of the element to be driven, among others the step size of a single step, the time of attenuation of oscillation of the mechanical components of the drive and the time for triggering the steeper flank of the ramp-shaped or sawtooth-shaped voltage pulse. This complicates the realization of a corresponding controller. The switching between the modes corresponds in each case to a discontinuity point which leads to a corresponding and disadvantageous discontinuity in the control signal. Finally, the method known from the prior art requires both a check as to whether a switchover to another mode is necessary, as well as for the respective attenuation of oscillation of the mechanical component of the drive in the discontinuous step mode a certain time, so that a comparatively slow control method results overall.

The invention is therefore based on the object to provide a method for controlling an electromechanical element, which overcomes the disadvantages of the known method. In particular, it is the object of the invention to provide a method for controlling an electromechanical element, in which the controller can be easily be realized and in which a multiple switching between different modes can be avoided, so that a fast, yet high-precision control method results.

This object is achieved by a method according to claim 1, wherein the subsequent dependent claims represent at least expedient developments.

Accordingly, the basis is a control method for an electromechanical element, in particular for a piezoelectric actor or a piezoactor, for positioning an element to be driven which is at least temporarily in contact with the electromechanical element or is in contact or frictional contact with the electromechanical element, in which method, in a step mode, electrical voltage pulses or voltage signals are applied on the electromechanical element. In this case, each voltage pulse comprises at least two time periods, wherein in one of the time periods an on average slower change over time of the electrical voltage occurs and in the other time segment an on average faster change over time of electrical voltage occurs. The at least two time segments can be separated, for example, by a discontinuity in the time profile of the voltage signal. In other words, the curve shape of the time-variable voltage signal can have a point of discontinuity.

The above term 'average' in connection with the terms 'slower change over time' and 'faster change over time' relates to the average inclination or gradient of the voltage pulse waveform over time in the respective section. The voltage pulse signal profile over time thus has a greater or smaller average gradient or inclination over time in one of its at least two time periods than in the corresponding other time segment. This is because it is conceivable that the voltage signal profile does not have a constant gradient or inclination over time in the two time periods, but the gradient or inclination varies there in regions. In this case, it is also conceivable for the individual regions to have constant and/or time-variable values of the gradient or inclination.

At least in part of the time period of the on average slower temporal change of the electrical voltage which defines a drive period, by static friction between the electromechanical element which expands or contracts substantially in the drive direction of the driven element and the driven element, the latter is moved by the electromechanical element, and at least in a part of the time period of the on average faster temporal change of the electrical voltage, which defines a relative movement period, by sliding friction between the electromechanical element which contracts or expands substantially in a direction contrary to the drive direction and the element to be driven, a relative movement between the electromechanical element and the element to be driven occurs.

The above term 'essentially' in connection with the terms 'in the drive direction' and 'contrary to the drive direction' means that the deviation of the expansion or contraction direction deviates from the drive direction of the driven element or of the direction contrary thereto is only slight and amounts to a maximum of 5 degrees.

Within the drive time period, a slower deformation of the electromechanical element takes place in a corresponding manner than within the relative movement time period. Therefore, within the drive time period with a comparatively slow deformation of the electromechanical element, due to the static friction which exists in this case between the electromechanical element and the element to be driven, the same is moved by the electromechanical element in the drive direction (stick phase). Within the relative movement time period with a comparatively rapid deformation of the actuator in a direction substantially contrary to the deformation direction within the drive time section, a sliding friction between the electromechanical element and the element to be driven occurs due to the inertia of the element to be driven, so that a relative movement takes place between the electromechanical element and the element to be driven (slip phase). In the slip phase, there is therefore no or only a negligible movement of the element to be driven.

By temporal sequence or by the successive execution of a stick phase and a slip phase, the element to be driven performs a discrete drive step in a first drive direction, while by temporal sequence or successive execution of a slip phase and a stick phase the element to be driven performs a discrete drive step in a second drive direction which is oriented contrary to the first drive direction. By appropriate repetition, a plurality of discrete drive steps and thus a large travel can be realized, which is limited in principle only by the extent or length of the element to be driven.

The method according to the invention further comprises the provision of a controller and a driver electrically connected thereto.

It is essential to the invention that the controller transfers a time-continuous current to the driver, and the driver outputs a corresponding charging current to the electromechanical element electrically connected thereto, wherein the controller adapts the time-continuous current depending on the difference between the actual position and the target position of the element to be driven steadily or continuously, and the driver regardless of the controller and alone depending on the voltage applied to the electromechanical element performs an electrical isolation of the driver from the controller.

In the case of a large difference between the actual position and the desired position, the value of the current signal transferred from the controller to the driver is high, and in an analogous manner, the charging current output by the driver to the electromechanical element is also high, so that within a comparatively short period of time, the electromechanical element is subjected to a defined electric charge or to a defined electric voltage. In this case, the driver monitors the electric charge applied to the electromechanical element or the correspondingly applied electric voltage. As soon as the electric charge or the electric voltage at the electromechanical element has reached or exceeded a pre-defined defined value, the driver automatically and independently of the controller performs an electrical isolation between the driver and the controller. However, the separation occurs only for a short period, which is significantly shorter than the previous period in which the electric charge was applied to the electromechanical element.

By said electrical isolation between the driver and the controller, it comes in a corresponding manner to a short-term interruption of the current signal applied to the electromechanical element so that the electric charges previously applied to the same can flow away. After the short-term interruption of the current flow between the driver and the electromechanical element, an electrical connection between the driver and the controller takes place again, so that to the electromechanical element again a defined electrical charge or a defined electrical voltage is applied.

Since the period of application of electric charges to the electromechanical element is greater than the period in which the previously applied electric charges flow off again, and thus the charging is slower than the unloading, the charging process corresponds to the drive period, and the discharge process corresponds to the relative movement period. The electrical isolation between the driver and the controller thus corresponds to switching from the drive period to the relative movement period.

It should be emphasized at this point that the time course of the electric voltage applied to the electromechanical element does not follow a predetermined function on the basis of the charging current transferred by the driver, but results automatically and independently and is defined by the applied current and the time or duration of the interruption of the electrical connection between the driver and the controller. In the first place, this results in a ramp-like or sawtooth-like profile of the voltage pulses applied to the electromechanical element. The frequency of these voltage pulses also results automatically from the current and the time or the duration of the interruption of the electrical connection between the driver and the controller. An active control of the frequency and/or the course of the voltage applied to the electromechanical element voltage over time is therefore not necessary.

It follows from the above that only the task is associated with the controller to regulate a time constant current as a function of the difference between the actual position and the target position of the element to be driven. The controller therefore only needs to take into account a controlled variable, namely the current. As already mentioned above, the controller itself does not have to set a specific shape of a voltage curve over time or a frequency of voltage pulses. The control of a time-constant current has the further advantage that the same amount of electric charge is applied to the electromechanical element in equal time intervals, and thereby a movement of the electromechanical element with a higher linearity can be realized.

It is also advantageous that the controller remains completely unaffected by the operation of switching from the drive time section to the relative movement time period, since this is done completely independently of the controller and autonomously by the driver. As a result, a relief of the controller is achieved, since the controller does not have to specify the point in time for triggering the steeper flank.

By repeated succession of the slower charging process described above and the respectively subsequent faster unloading operation, i.e. due to the repeated sequence of drive time section and relative movement time section, the result is a high, in particular a maximum drive speed of the element to be driven due to the high charging current, which is supplied to the electromechanical element, in the presence of a large difference between the actual position and the target position, since—as stated above—the electromechanical element is acted upon in a comparatively short time with a defined amount of charge, and the drive period can be repeated with a correspondingly high frequency (drive frequency). It should be mentioned here that the drive time sections each follow the relative movement sections without a break.

With a steadily decreasing difference between the actual position and the target position of the element to be driven, there is a continuous adaptation or reduction of the electric current transferred from the controller to the driver, so that further in a continuous manner, i.e. without time interval between subsequent drive and relative movement sections, voltage pulses are applied to the electromechanical element, wherein, however, due to the steady adjustment of the current value due to the steadily changing difference between the actual position and target position of the driven element the respective time period with an on average slower temporal change of the electrical voltage applied to the electromechanical element comprises an ever-increasing duration, while the time period with an on average slower temporal change of the electrical voltage applied to the electromechanical element remains substantially unchanged.

Due to the now longer duration of the drive time period at approximately constant duration of the relative movement section, the drive frequency decreases. This decrease of the drive frequency takes place in an analogous manner continuously and as a function of the decreasing difference between the actual position and the target position of the element to be driven.

In the most favorable case, the target position of the element to be driven with the desired accuracy is already achieved solely by the above-described type of control, i.e. alone in the step mode, so that switching to an analogue mode, in which the electromechanical element exerts a deformation, which is analogous to the applied electrical voltage, with a very high resolution, can be completely omitted, which makes the control again easier and faster.

It may, however, be advantageous for the step mode to be followed by an analogue mode in which the electromechanical element is subjected to a time-variable continuous electrical voltage, so that the electromechanical element follows the voltage signal linearly and the element to be driven performs a corresponding continuous and analogous movement. As a result, an even higher accuracy in the positioning of the element to be driven can be achieved in the individual case.

Furthermore, it may be advantageous that the controller transfers a digital signal to the driver which determines whether in the period of the electrical voltage pulse with an on average slower temporal change of the electrical voltage, the amount of electrical voltage increases or decreases. As a result, the drive direction for the driven element is determined.

In addition, it may be advantageous that the time-continuous stream passed from the controller to the driver is such that the speed of the element to be driven follows a defined profile between its actual position and its target position. Here, in particular, an S-shaped profile is of importance, in which the speed of the element to be driven at the beginning of the corresponding positioning is very slow, then steadily increases up to the maximum possible speed and before reaching the target position up to this point, the speed is steadily reduced.

Furthermore, the invention relates to a device for electrically actuating an electromechanical element for positioning an element to be driven which is in contact at least intermittently with the electromechanical element, wherein the device configured such that, in a step mode, the electromechanical element is subjected to directly successive electrical voltage pulses, wherein each voltage pulse comprises at least two time periods, and wherein in one of the periods of time an on average slower temporal change of the electrical voltage and in the other period of time an on average faster temporal change of the electrical voltage takes place, and at least in part of the time period of the on average slower temporal change of the electrical voltage which defines a drive period, by static friction between expanding or contracting electromechanical element and the driven element in the drive direction, the latter is moved by the electromechanical element, and at least in a part of the time period of the on average faster temporal change of the electrical voltage, which defines a relative movement period, by sliding friction between the electromechanical element which contracts or expands in a direction contrary to the drive direction and the element to be driven, a relative movement between the electromechanical element and the element to be driven occurs, so that the element to be driven with each voltage pulse performs a discrete step in the drive direction, and wherein the device comprises a controller and of a driver electrically connected to the latter, wherein the controller feeds a time-continuous current via a driver interface to the driver and the driver outputs a corresponding charging current to the electromechanical element electrically connected thereto, and wherein the controller is configured such that the same adapts the time-continuous current in dependence of the difference between the actual position and the target position of the element to be driven, and the driver performs an electrical separation of the driver from the controller independently of the controller and depending on the voltage applied to the electromechanical element.

It may be advantageous that the driver comprises a current driver, a first switch, a second switch and a comparator, the output of the current driver being connected to an input of the first switch and the output of the second switch being connected to another input of the first switch, and in that the output signal at the output of the first switch is fed to the electromechanical element and the input of the comparator, wherein the output of the comparator is connected to a control input of the first switch to control, depending on the level of the output signal, whether the signal of the second switch is applied to the output of the first switch.

Figure 1:
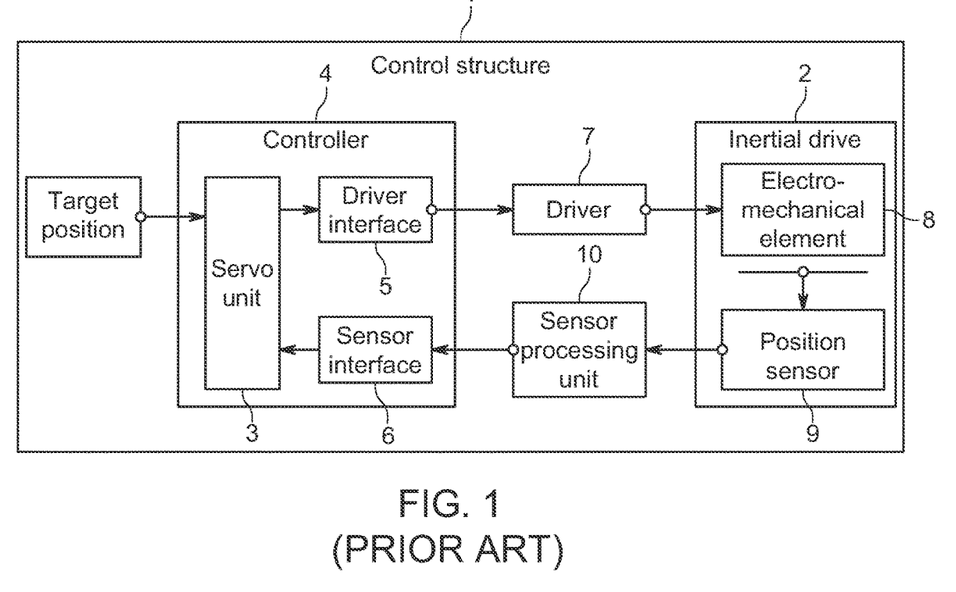
FIG. 1 shows a basic control structure relating to a piezo inertia drive according to the prior art.

FIG. 1 shows in a general manner a control structure 1 for a piezo inertia drive 2 used at the applicant and therefore attributable to the prior art. Here, the target position of the drive is passed to a servo unit 3 of a controller 4, which in turn is connected to a driver interface 5 of the controller 4. Furthermore, the controller 4 has a sensor interface 6. The driver interface 5 transfers to the driver 7 a signal corresponding to the target position, and the driver 7, which is electrically connected to an electromechanical element 8 in the form of a piezoactuator of the piezo inertia drive 2, acts on the electromechanical element 8 with an amount of charge corresponding to the electrical signal so that it performs a desired time-variable expansion or contraction. A position sensor 9 assigned to the inertial drive 2 detects its position, and a corresponding signal is transmitted to the sensor interface 6 of the controller 4 after processing by a sensor processing unit 10, where it is fed to the servo unit 3 so that—depending on the instantaneous position (i.e. the actual position) of the inertial drive 2 compared to the target or nominal position—the servo unit 3 either continues to transfer electrical signals to the driver 7 via the driver interface 5 to apply the electromechanical element 8 per drive step with corresponding amounts of charge, or after reaching the target position with a given accuracy no further electrical signals are passed to the driver 7.

Figure 2:
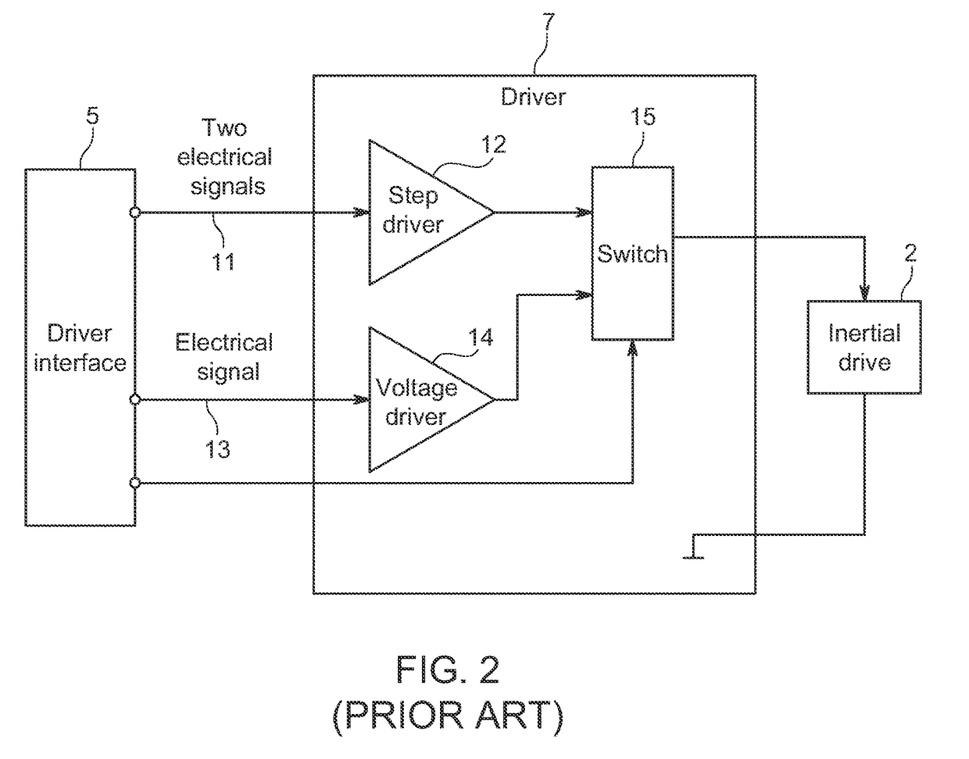
FIG. 2 shows a detailed representation of the driver interface and the driver with the corresponding signal flows according to the prior art according to the control structure of FIG. 1.

FIG. 2 shows the connection between the driver interface 5 and the driver 7 of the control structure according to FIG. 1 in detail. The driver interface 5 transmits two electrical signals 11, namely a pulse signal and a direction signal, to the step driver 12 of the driver 7, and on the other hand, an electrical signal 13, namely an analogue voltage signal, to the voltage driver 14 of the driver 7. The step driver 12 and the voltage driver 14 pass the electrical signals which are processed by themselves through the respective inputs of a switch 15. At the same time there is a connection between the driver interface 5 and the switch 15 of the driver 7, whereby the driver interface 5, depending on the corresponding position data of the inertial drive, can take influence on the drive mode of the inertial drive by appropriate electrical signals or can accomplish a change of the drive mode of the inertial drive. The corresponding voltage signal is then supplied to the electromechanical element of the inertial drive 2, not shown in FIG. 2, via the output of the switch 15, so that the latter performs a desired time-variable expansion or contraction.

Figure 3:
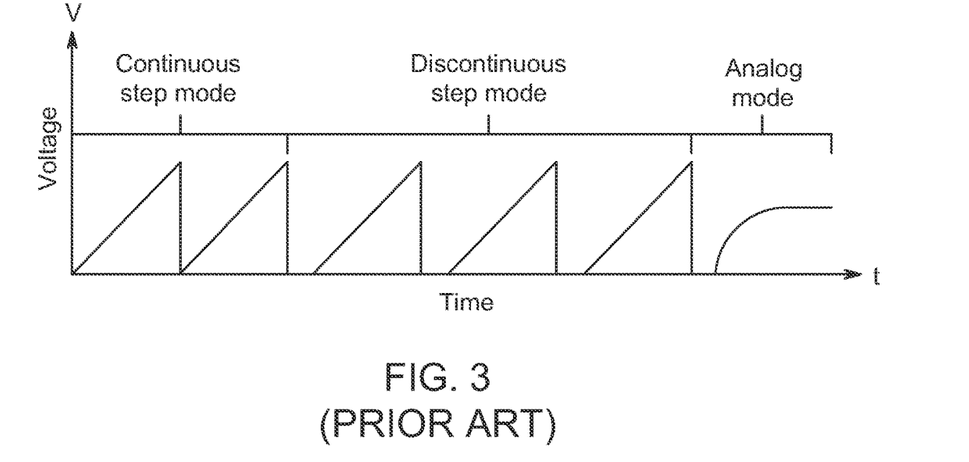
FIG. 3 shows a schematic representation of the voltage pulses applied to an electromechanical element for approaching a target position of a driven element according to the prior art.

FIG. 3 shows schematically the time course of the individual voltage pulses applied to the piezoelectric actuator, which is driven by the method described above and known from the prior art. In this case the individual voltage pulses have an identical ramp shape with a flatter rising flank and a steep falling flank. As long as the element to be driven is far away from the desired or target position, the voltage pulses are applied in such a way that they succeed one another in time without interruption. This is the continuous step mode (see the first two voltage pulses in the voltage-time diagram of FIG. 3). If the controller recognizes, based on the signals from the position sensor, that the element to be driven has reached a position which lies within a defined value window around the target position, the controller causes a switching to the discontinuous mode, in which between successive voltage pulses—which have the same shape as in the continuous step mode—a time interval exists. As soon as the element to be driven has reached a position whose difference from the target position lies within the deformation range of the piezoactuator, the controller switches again, namely to the analogue mode, in which the element to be driven analogously follows the expansion or deformation of the piezoactuator. The piezoactuator is deflected by appropriate charge loading only until the element to be driven has reached the target position.

The driver interface 5 of the controller 4 must be provided a variety of information to realize a precise and reliable control of the inertial drive. These include, in addition to the difference between the actual position and the desired position of the element to be driven of the inertial drive, the step size of a single step, the frequency of a predetermined drive step, the maximum electrical voltage that may be applied to the piezoelectric element 8, the linear range of inertial drive, the resonance frequency of the inertial drive and its damping behavior and the definition of a position window for the selection of the drive mode. The driver 7 must be provided with the frequency of a specified drive step and the maximum electrical voltage which may be applied to the piezoelectric element 8 as information.

Figure 4:
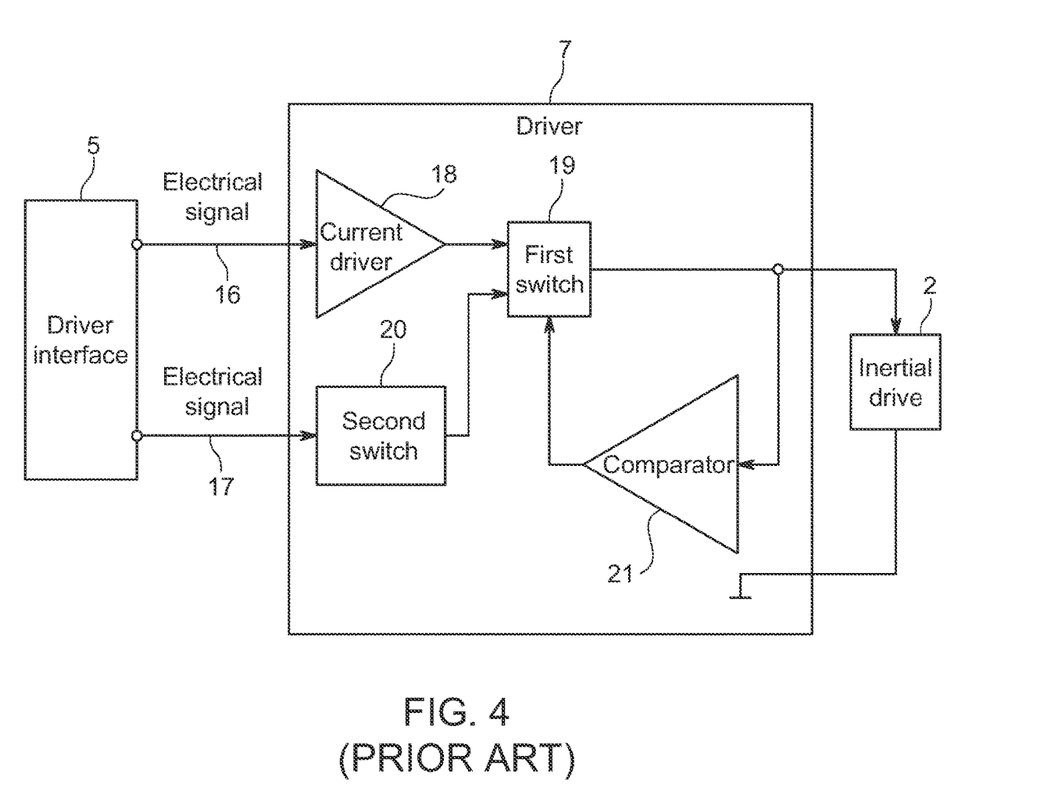
FIG. 4 shows a detailed representation of the driver interface and of the driver of a device according to the invention.

FIG. 4 shows in detail the connection between the driver interface 5 and the driver 7 of the control structure according to FIG. 1 of a device according to the invention, which is suitable for an inventive control method. The driver interface 5 is arranged to pass an electrical signal 16, which is an analogue current signal, to the current driver 18. Furthermore, the driver interface 5 transfers an electrical signal 17, which is a direction signal, to the second switch 20 of the driver 7. The output of the current driver 18 and the output of the second switch 20 are connected to corresponding inputs of the first switch 19, and via the output of the first switch 19, a defined charging current or a defined amount of charge is supplied to the piezoactor of the inertial drive 2 and the input of a comparator 21, wherein the output of the comparator 21 is connected to a control input of the first switch 19.

The comparator 21 receives via its input the current electrical voltage level of the output of the first switch 19 and controls via its output depending on the current voltage level, the first switch 19 such that the signal of the second switch 20 is present at the output of the first switch 19 or not. Depending on the respective desired drive direction, the output of the second switch 20 leads either to the maximum possible positive or the maximum possible negative specific voltage level for the piezoactor. If the current voltage level is near the maximum possible positive or negative voltage level of the piezoactor, then the selected signal from the second switch 20 is applied to the output of the first switch 19 via the comparator 21, so that a voltage ramp is produced which changes very rapidly over time. The term "near" in the sense of the above means that the current voltage level has a maximum deviation of 20% from the maximum possible positive or maximum possible negative voltage level of the piezoelectric actuator.

Figure 5:
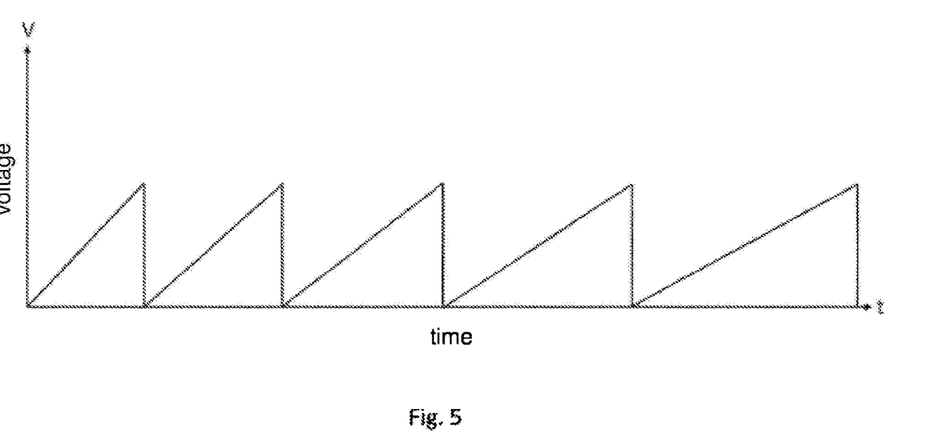
FIG. 5 shows a schematic representation of voltage pulses applied to an electromechanical element or approaching a target position of a driven element according to the method according to the invention.

FIG. 5 schematically shows the time profile of the individual voltage pulses applied to a piezoactor, which is controlled according to the method according to the invention. In contrast to the method known from the prior art, the individual voltage pulses follow one another without a time interruption or with a very slight and negligible time difference. In addition, the successive voltage pulses differ in shape, with the slope of the flatter flank decreases continuously with each successive voltage pulse, so that the pulse duration—with constant maximum voltage of each voltage pulse—becomes continuously larger.

In the control method according to the invention, the driver interface 5 of the controller 4 only actuator specific information must be provided for realizing accurate and reliable control of the inertial drive, and the driver requires only the information relating to the maximum voltage, which are subjected to the piezoelectric element of the inertial drive or may abut apply to the piezoelectric element. Thus, the realization is considerably simpler to design than in the control method known from the prior art. Moreover, compared with the prior art, a continuous linear current output of the servo unit and the driver results without discontinuities due to mode change or monitoring time periods, i.e. time periods for monitoring a decay time of the inertial drive. Overall, a much more linear behavior of the inertial drive results.

Figure 6:
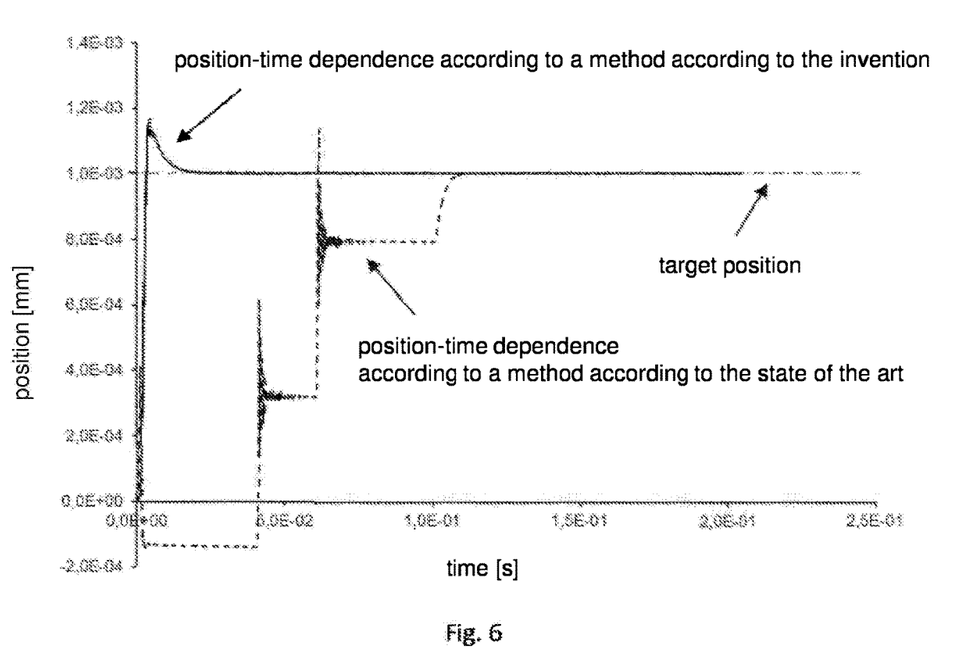
FIG. 6 shows a measured value diagram for a comparative illustration of the position-time dependence between a known control method and the control method according to the invention for a piezo inertial drive with a drive of 1 μm in a first direction (forward direction).

FIG. 6 is a measured value diagram for comparing the position-time dependence between a known control method and the control method for a piezo inertia drive according to the invention. It can be clearly seen that the target position of the element to be driven of the inertial drive is achieved much faster by the method according to the invention. This is due in particular to the fact that there are only very slight or negligible differences in time between the individual drive steps, whereas in the drive method according to the prior art it is necessary to wait a relatively long time after a single drive step until the mechanical system of the inertial drive has reached a swung-out state, and only thereafter it can decided with which mode the inertial drive is to be controlled in a subsequent step.

Figure 7:
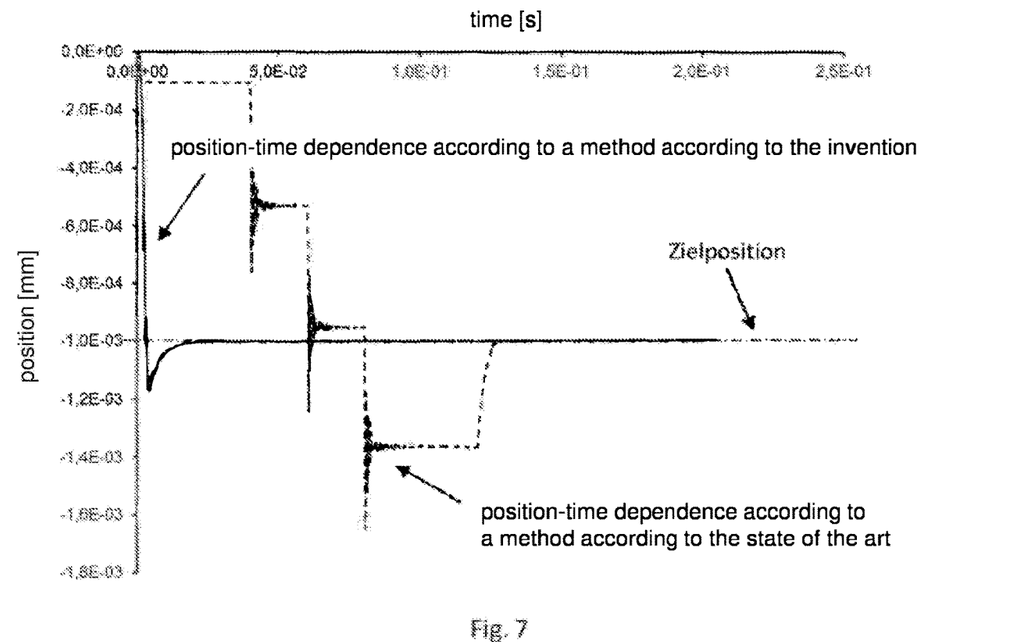
FIG. 7 shows a measured value diagram for comparing the position-time dependence between a known control method and the control method according to the invention for a piezo inertia drive with a drive of 1 μm in a second direction (reverse direction).

FIG. 7 also shows a measured value diagram for comparing the position-time dependence between a known control method and the control method for a piezo inertia drive according to the invention, but here for a drive step in a backward direction after a previous forward step. Again, it can be seen that the target position of the element to be driven of the inertial drive is achieved considerably faster by the drive method according to the invention than by the drive method according to the prior art.

Figure 8:
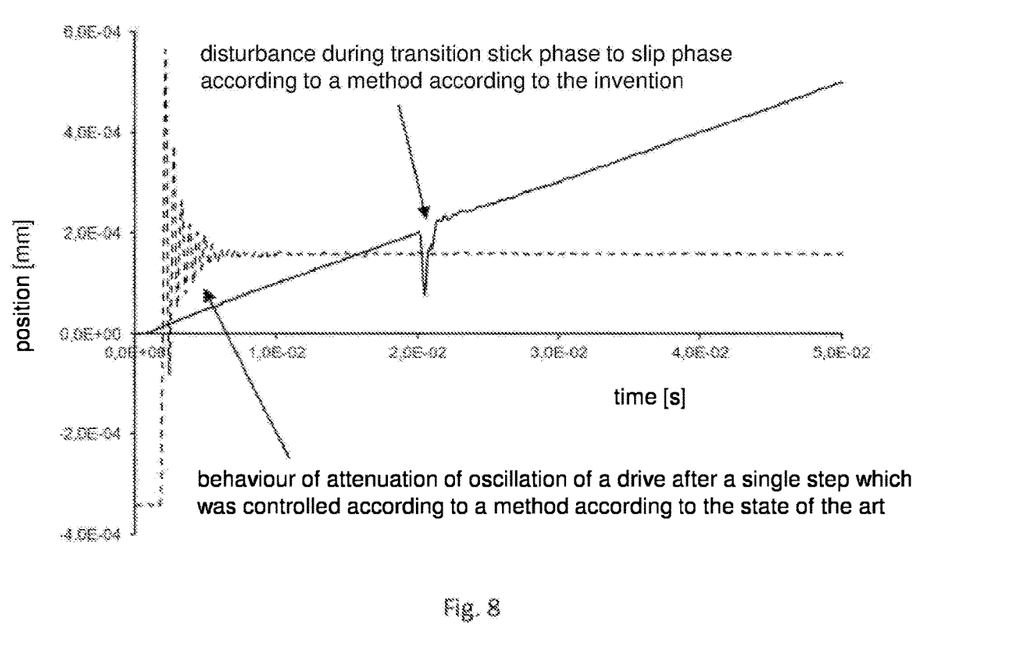
FIG. 8 shows a measured value diagram for a comparative illustration of the dynamic behavior of a piezo inertia drive according to a step control according to the known method and according to the control method according to the invention.

FIG. 8 shows a further measured value diagram, which on the one hand shows the behaviour of an inertial drive after a step control according to the drive method known from the prior art. It can be clearly seen that after the pulse-like drive movement, the system of inertial drive is excited to disadvantageous vibrations, which require a relatively long swing-out time, wherein only after the decaying of oscillation a highly accurate determination of the current position of the element to be driven is possible. This means that after such a single step, the next single step can be started only after waiting for the decaying of oscillation, from which a comparatively slow and less dynamic control method results.

On the other hand, the measured value diagram of FIG. 8 shows a position-time curve of the driven element of an inertial drive, which was controlled by the method according to the invention. At the time of change from the drive period to the relative movement period only a slight disturbance in the position-time curve can be seen, and it does not come to the decaying of oscillation of the drive system which is known from the prior art and which is disadvantageous. Therefore, after a single step, with each phase of approaching the target position it can be started directly with a subsequent single step, resulting in a very fast and highly dynamic control method and a corresponding inertial drive.

Figure 9:
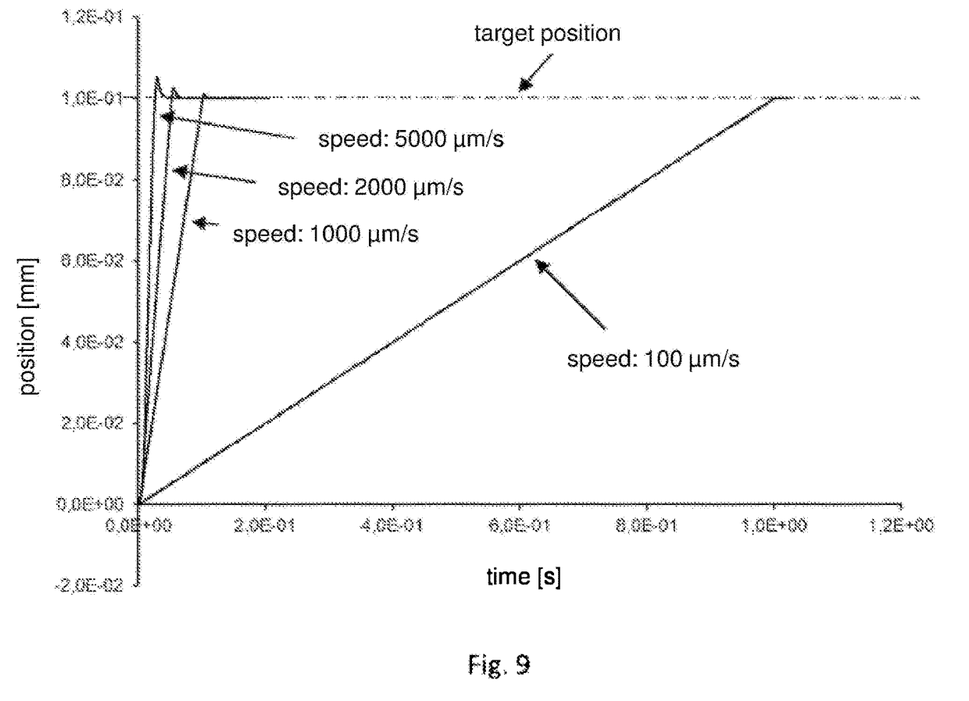
FIG. 9 shows a measured value diagram for illustrating the position-time dependence in the control method according to the invention for a piezo inertia drive at different speeds to achieve the target position.

FIG. 9 illustrates in a further measured value diagram, in which the position of the driven element of a piezo inertial drive over time is shown, the improved possibilities of the control method according to the invention. With the inertial drive, when appropriately driven, the element to be driven can be moved to a target position highly dynamically and quasi linearly at different speeds.

Figure 10:
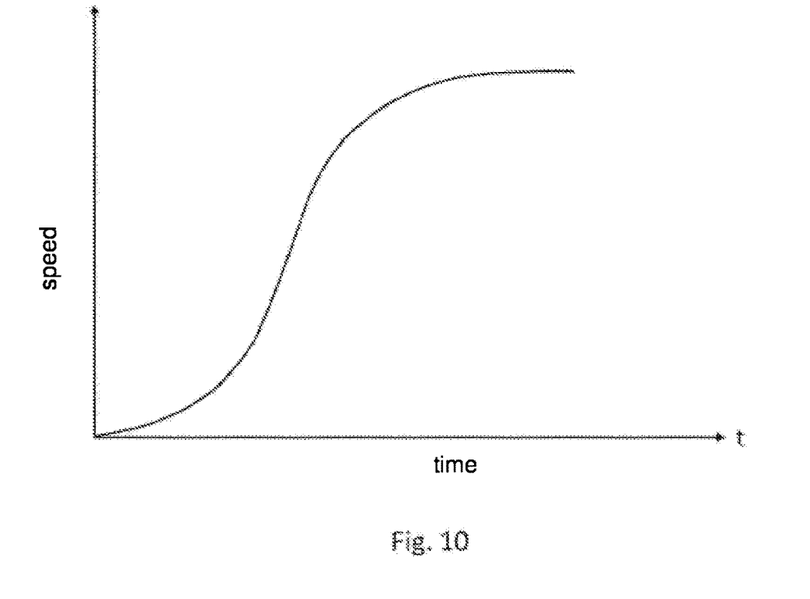
FIG. 10 shows a diagram showing the speed of a driven element over time using the control method according to the invention.

With the control method according to the invention, it is also possible in a comparatively simple way to approach the target position of the element to be driven along a non-linear positioning curve with drive step sizes deviating from one another per time unit. According to FIG. 10, the element to be driven can be moved at the beginning of the positioning with a lower drive speed in order to increase the drive speed continuously up to the maximum drive speed thereafter, in order to continuously lower the drive speed of the driven element before reaching the target position, thus resulting in a time curve with an S-shape. Thus, the control method according to the invention or the corresponding device is also suitable for dynamic applications for which other drive concepts have hitherto been used.

What is claimed is:

1. A control method for an electromechanical element (8) comprising the steps of:
    applying, in a step mode, electric voltage pulses to the electromechanical element (8) wherein each voltage pulse has at least two time periods;
    applying in a first of the two time periods an on average slower temporal change of the electrical voltage, the first of the two time periods defining a first pulse;
    applying in a second of the two time periods an on average faster temporal change of the electrical voltage, the second of the two time periods defining a second pulse; and
    moving by static friction the driven element with the electromechanical element (8) at least in part of the first of the two time periods to define a drive period;
    moving by sliding friction the driven element with the electromechanical element (8) at least in a part of the second of the two time periods to define a relative movement period, the element to be driven performing a discrete step in the drive direction with each second pulse;
    electrically connecting a controller (4) and a driver (7);
    feeding by the controller of a time-continuous current (16, 17) to the driver (7);
    outputting from the driver (7) a corresponding charging current to the electromechanical element (8) electrically connected to the controller;
    continuously adapting by the controller of a time-continuous current (16, 17) based on the difference between an actual position and a target position of the element to be driven; and
    electrically separating the driver (7) from the controller (4) independent of the controller (4) depending on the voltage applied to the electromechanical element (8).

2. The control method according to claim 1, wherein the time-continuous current (17) is a digital signal (17), the time-continuous current (17) determining whether in the drive period, the amount of voltage applied to the electromechanical element increases or decreases with increasing duration.

3. The control method of claim 1 wherein the step mode is followed by an analogue mode in which the electromechanical element (8) is subjected to a time-variable continuous electrical voltage so that the electromechanical element (8) follows the voltage signal linearly and the element to be driven performs a corresponding continuous and analogue movement.

4. The control method according to claim 1, wherein the time-continuous current defines the speed of the element to be driven between its actual position and its target position, the speed of the element to be driven between its actual position and its target position comprising a defined time dependence with a corresponding speed-time curve.

5. The control method according to claim 2, wherein the time-continuous current defines the speed of the element to be driven between its actual position and its target position, the speed of the element to be driven between its actual position and its target position comprising a defined time dependence with a corresponding speed-time curve.

6. The control method according to claim 2 wherein the time-continuous current defines the speed of the element to be driven between its actual position and its target position, the speed of the element to be driven between its actual position and its target position comprising a defined time dependence with a corresponding speed-time curve.

7. The control method according to claim 3 wherein the time-continuous current defines the speed of the element to be driven between its actual position and its target position, the speed of the element to be driven between its actual position and its target position comprising a defined time dependence with a corresponding speed-time curve.

8. The control method according to claim 4, wherein the speed-time curve has an S-shape.

9. The control method according to claim 5 wherein the speed-time curve has an S-shape.

10. The control method according to claim 6 wherein the speed-time curve has an S-shape.

11. The control method according to claim 7 wherein the speed-time curve has an S-shape.

12. A device (1) for electrically actuating an electromechanical element (8) for positioning an element to be driven which is in contact at least intermittently with the electromechanical element (8), wherein the device (1) comprises a controller (4) and a driver (7) electrically connected to the controller, the controller (4) and the driver (7) configured such that, in a step mode, the electromechanical element (8) is subjected to directly successive electrical voltage pulses, wherein each voltage pulse comprises at least two time periods;
    wherein in a first of the two time periods is an on average slower temporal change of the electrical voltage and in a second of the two time periods is an on average faster temporal change of the electrical voltage takes place;
    wherein at least in part of the first time period defining a drive period, by static friction between expanding or contracting electromechanical element (8) and the driven element in the drive direction, the electromechanical element (8) moving by static friction the driven element with the electromechanical element (8); wherein at least in a part of the second time period defining a relative movement period, by sliding friction between the electromechanical element (8) which contracts or expands in a direction contrary to the drive direction and the element to be driven, the sliding friction defining a relative movement between the electromechanical element (8) and the element to be driven occurs, so that the element to be driven with each voltage pulse performs a discrete step in the drive direction: wherein the controller (4) is configured to feed a time-continuous current via a driver interface (5) to the driver (7) and the driver (7) is configured to output a corresponding charging current to the electromechanical element (8) electrically connected thereto, and wherein the controller (4) adapts the time-continuous current (16, 17) based on the difference between an actual position and a target position of the element to be driven, and the driver (7) performs an electrical separation of the driver (7) from the controller (4) independently of the controller (4) depending on the voltage applied to the electromechanical element (8).

13. The device according to claim 12, wherein the driver (7) comprises a current driver (18), a first switch (19), a second switch (20) and a comparator (21), the output of the current driver (18) being connected to an input of the first switch (19) and the output of the second switch (20) being connected to another input of the first switch (19) and wherein the output signal at the output of the first switch (19) is fed to the electromechanical element (8) and the input of the comparator (21);

wherein the output of the comparator (21) is connected to a control input of the first switch (19) to control, the output signal determining whether the signal of the second switch (20) is applied to the output of the first switch.

14. The device according to claim 12, wherein the time-continuous current (17) is a digital signal (17), the time-continuous current (17) determining whether in the drive period, the amount of voltage applied to the elctromechanical element increases or decreases with increasing duration.

15. The device according to claim 12, wherein the step mode is followed by an analogue mode in which the electromechanical element (8) is subjected to a time-variable continuous electrical voltage so that the electromechanical element (8) follows the voltage signal linearly and the element to be driven performs a corresponding continuous and analogue movement.

16. The device according to claim 12, wherein the time-continuous current defines the speed of the element to be driven between its actual position and its target position, the speed of the element to be driven between its actua position and its target position comprising a defined time dependence with a corresponding speed-time curve.

17. The device according to claim 16, wherein the speed-time curve has an S-shape.

\* \* \* \* \*